FIELD EFFECT TRANSISTOR WITH A JUNCTION PARALLEL TO THE (111) PLANE OF THE CRYSTAL

Filed Aug. 27, 1963

INVENTOR.
ALBERT M. SKELLETT
BY
Eyre, Mann & Lucas
ATTORNEYS

United States Patent Office 3,302,078
Patented Jan. 31, 1967

3,302,078

FIELD EFFECT TRANSISTOR WITH A JUNCTION PARALLEL TO THE (111) PLANE OF THE CRYSTAL

Albert M. Skellett, Madison, N.J., assignor to Tung-Sol Electric Inc., a corporation of Delaware Filed Aug. 27, 1963, Ser. No. 304,814
1 Claim. (Cl. 317—235)

This invention relates generally to field effect transistors and more particularly to the method of fabricating field effect transistors having improved performance.

Field effect transistors of present designs have current carrying channels that are uniform in thickness. The effect of thickness in such devices is varied by the expansion into the channel of depletion regions associated with the boundry junctions. Since current cannot flow in the depletion regions, as they expand from top and bottom of the channel they gradually pinch off the current. However, there is a variation of potential along the channel length of this variation results in a variation in the thickness of the depletion regions along the channel. As a result, the effective channel thickness varies along the length of the channel and the pinch-off occurs at one point near the drain end. Superior performance would be obtained if the effective thickness, as determined by the edges of the depletion regions, were maintained constant and the pinch-off occured uniformly along the channel length. The present invention provides this desirable feature.

One of the objects of this invention is to provide an improved field effect transistor which avoids one or more of the disadvantages and limitations of prior art arrangements.

Another object of the invention is to improve the characteristics of a field effect transistor.

Another object of the invention is to make the input-output response more linear.

Another object of the invention is to provide a sharper cut-off voltage for the control signal.

Another object of the invention is to eliminate high temperature spots within the transistor body.

Another object of the invention is to increase the transconductance of field effect transistors.

The invention comprises a field effect transistor comprising a central channel region of one conductivity type having source and drain connections. The central channel is bordered by material of opposite conductivity type. The central channel is formed so that it has a varying thickness between the source and drain electrodes.

The method of manufacturing the field effect transistor includes the following steps: diffusing into a semi-conductor body a dopant to produce a layer of opposite conductivity type, alloying a dopant into the upper portion of said layer to produce a surface layer having the original conductivity type. These steps create a channel between the body and the surface layer bounded by junctions. The creation of the surface layer includes the application of a doping agent which varies in thickness along the channel length. Another feature of the invention includes the orientation of the crystal structures of the semi-conductor body so that the 111 crystalline plane is oriented in a manner to form the junction at a greater depth near the source end.

For a better understanding the present invention, together with other and further objects thereof, reference is made to the following description taken in connection with the accompanying drawings.

Figures 1, 2, 3, 4:
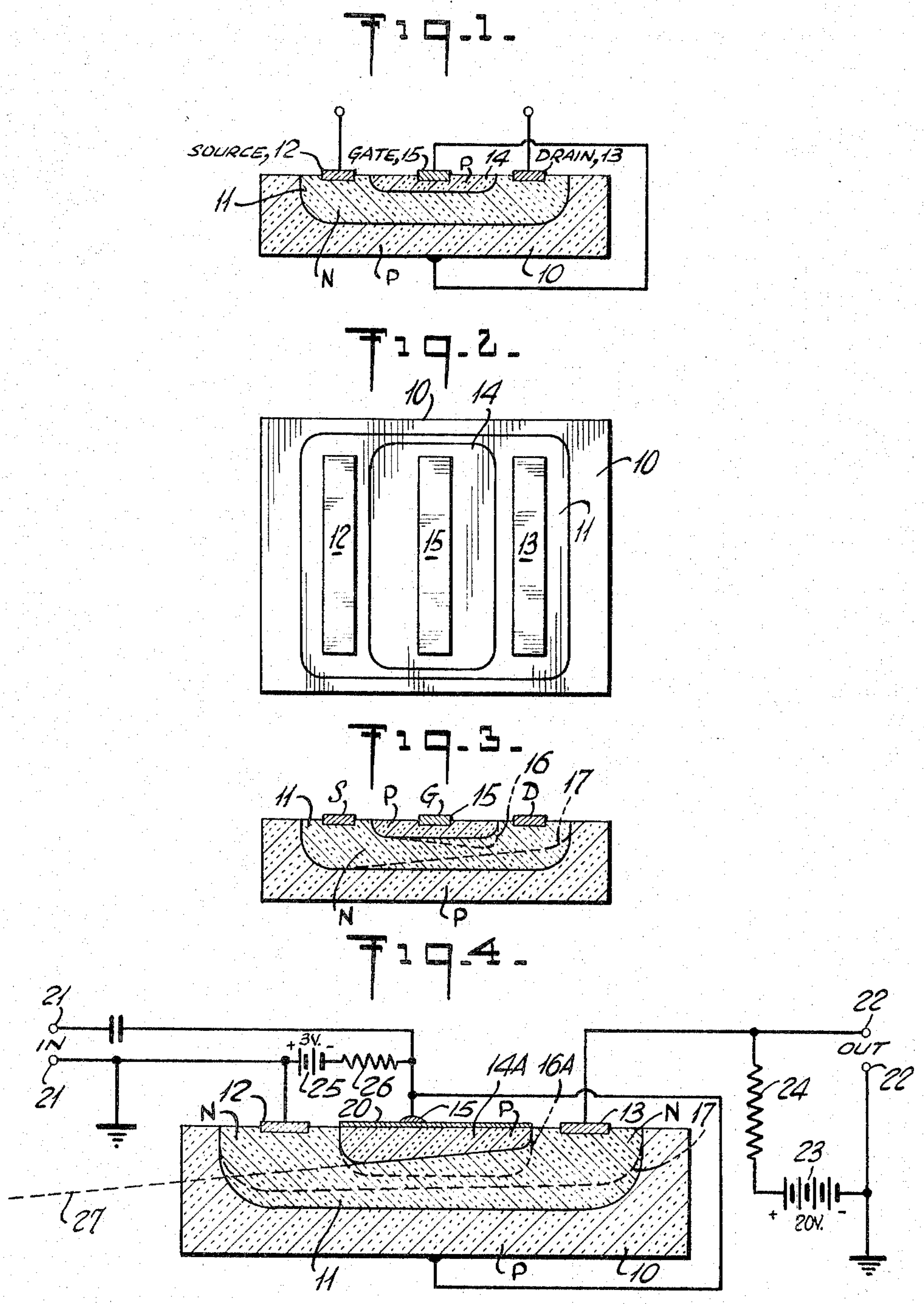
FIG. 1 is a cross sectional view of a prior art field effect transistor showing the channel between source and drain having a uniform thickness.
FIG. 2 is a plan view of the transistor shown in FIG. 1.
FIG. 3 is a cross sectional view similar to FIG. 1 but indicating the depletion regions when the current between the source and drain is near the pinched off condition.
FIG. 4 is a cross sectional view of a field effect transistor made in accordance with the principles of the invention. This figure, which is not to scale, shows a channel of variable thickness and a surface layer or upper gate also having a variable thickness.

Referring now to FIGS. 1, 2, and 3, a semi-conductor body 10 of P-type conductivity includes a channel 11 of N-type conductivity. The ends of this channel are terminated by electrodes 12 and 13 which constitute the source and drain electrodes of the transistor. A third layer 14 having P-type conductivity borders the channel 11 and supports a gate electrode 15. This construction provides two junctions between the N and P regions and these junctions provide the gate action.

When current flows through the channel 11 between the source and drain electrodes, there exists a potential difference along this distance. Now, when a controlling voltage is applied to the gate electrode 15, a distorted electric field is produced within the transistor body. This electric field produces depletion regions as indicated by the dotted lines 16 and 17. In FIG. 3 the depletion regions are close to each other and the addition of a higher gate voltage will cause these regions to touch and thereby pinch off conductance between the source and drain electrodes. It should be noted that this pinch off effect occurs at a single point along the channel length and, because of this, the high resistance which is effective in reducing the current flow is concentrated at this point and the amount of heat generated by the current flow just prior to extinction is also concentrated at this point. The combined results of these effects are: first, an unequal distribution of heat, and second, a less sensitive control by the gate voltage than would be obtained if the depletions met along the length of the channel. Also, in the practical application of these transistors, the cut-off point of channel current exhibits a trailing characteristic.

The cross sectional view shown in FIG. 4 illustrates the construction of a field effect transistor which eliminates the above described disadvantages. This figure shows a semi-conductor body of P-type conductivity and having an N-type portion diffused into the body to form a junction in the usual manner. As indicated in the figure, the bottom surface of the diffused portion which is the junction is substantially flat and is parallel to the upper body surface. In order to form the top surface P-type layer, a doping agent, which may be metallic aluminum, is deposited on the upper surface with the left edge considerably thicker than the right edge. This wedge formation may be produced by evaporation from a heated aluminum wire positioned above and to the left of the surface on which the deposit is to be made. All other portions are protected by a mask and the result is a wedge formation.

The aluminum is now alloyed into the top surface by the usual alloying procedure which includes heating the entire body to a temperature which is somewhat less than the melting point of the aluminum. Because the two metals are in contact, a eutectic alloy will be formed at the interface having a melting point less than the temperature of the body. The aluminum is absorbed into the top surface and forms the P-type conductivity layer desired. Because the aluminum is in a wedge shape, the amount of penetration of the aluminum is greater on the left side and the result is a P-type layer having a wedge shape and a lower surface or P-N junction which is not parallel to the lower boundary of the N-type channel where the other N-P junction lies.

If the field effect transistor shown in FIG. 4 is connected to the usual potentials and a gate voltage applied, the resultant depletion regions are wedge-shaped as indicated in FIG. 4 but the channel between them is bounded by parallel edges. The result is a conducting channel which is practically uniform in width, and when the cut-off voltage is approached, the current between the source and drain electrodes is reduced to zero by cut-off along substantially the whole channel length. It should be noted that this condition depends upon the value of the applied voltage 23.

An amplifier circuit is shown in FIG. 4 in order to illustrate the practical application of such a transistor. The circuit comprises input terminals 21 which are coupled to the gate electrode and the source electrode. Output electrodes 22 are coupled to the drain electrode and to ground. The drain and source electrodes are connected in series with a source of potential 23 and a load resistor 24. The gate electrode is biased by a small source of potential 25 in series with an input resistor 26.

Input signals of varying voltage are thus applied by the gate electrodes to the two back-biased junctions causing the depletion regions in the channel to move toward and away from each other. This action effectively varies the physical width of the conducting channel since current cannot flow through the depletion regions. This varying width of channel shows up electrically as a varying resistance between the source and drain electrodes and the output current thus varies in accordance with the input voltage.

The above described method of producing a wedge type layer 14A may be supplemented by the orientation of a semi-conductor body having a 111 crystal plane which makes an angle with the top surface of the transistor body. This plane is indicated in FIG. 4 by dotted line 27.

It is well known that an alloyed junction tends to follow the 111 crystal plane so that by this orientation the upper junction of the device may be made accurately to lie along the desired direction; that is, to lie along the 111 crystal plane. Furthermore, as is also well known, this method produces a very flat planar junction.

The diffusion process, however, does not follow any crystalline plane but the advancing edge in the diffusion process proceeds into the crystal always being parallel to the surface through which the diffusion takes place. Thus, the lower junction is parallel to the upper surface.

The extent of the depletion regions just prior to extinction is illustrated by dotted lines 16A and 17. These dotted lines are not exactly parallel as shown in the drawing and the conducting channel between them is not quite uniform in thickness. However, the heat generated by the passage of current is distributed over a large space and no hot spots are formed. Exact parallelism of the depletion boundaries can be effected at current extinction by a small adjustment of the voltage 23 or resistance 24. In order to illustrate the characteristics of the invention, certain dimensions shown in the drawings have been greatly exaggerated.

The foregoing disclosures and drawings are merely illustrative of the principles of this invention and are not to be interpreted in a limiting sense. The only limitations are to be determined from the scope of the appended claim.

I claim:

A field effect transistor comprising a conducting channel having source and drain electrodes, said channel bounded by a first diffused junction and a second alloyed junction, said junctions not in parallel relationship, the first junction being parallel to one of the surfaces of the transistor and the second junction being parallel to the 111 plane of the crystal, said 111 plane having an orientation at an angle with respect to said surface, and said transistor having ohmic contacts on the two gate regions lying on opposite sides of the channel.

References Cited by the Examiner

UNITED STATES PATENTS

| | | | |
|---|---|---|---|
| 2,805,397 | 9/1957 | Ross | 332—52 |
| 2,869,055 | 1/1959 | Noyce | 317—235 |
| 2,984,752 | 4/1961 | Giacoletto | 307—88.5 |
| 3,010,033 | 11/1961 | Noyce | 307—88.5 |
| 3,171,042 | 2/1965 | Matare | 307—88.5 |

JOHN W. HUCKERT, *Primary Examiner.*

M. H. EDLOW, *Assistant Examiner.*